United States Patent [19]
Woo et al.

[11] Patent Number: 5,476,805
[45] Date of Patent: Dec. 19, 1995

[54] METHOD FOR FABRICATING STORAGE ELECTRODE OF DYNAMIC RANDOM ACCESS MEMORY CELL

[75] Inventors: Sang H. Woo; Ha E. Jeon, both of Kyoungki-do, Rep. of Korea

[73] Assignee: Hyundai Electronics Industries, Inc., Rep. of Korea

[21] Appl. No.: 151,182

[22] Filed: Nov. 12, 1993

[30] Foreign Application Priority Data

Nov. 12, 1992 [KR] Rep. of Korea .................... 92-21153

[51] Int. Cl.⁶ ............................................. H01L 21/8242
[52] U.S. Cl. ........................ 437/52; 437/47; 437/60; 437/233; 437/919
[58] Field of Search ........................ 437/47, 48, 52, 437/60, 233, 919; 257/307, 308

[56] References Cited

U.S. PATENT DOCUMENTS 4,363,828  12/1982  Brodsky et al. ............................ 427/38
5,071,783  12/1991  Taguchi et al. ............................ 437/60
5,286,668   2/1994  Chou ........................................ 437/919

OTHER PUBLICATIONS

Wolf, "Silicon Processing for the VLSI Era" vol. 1; 1989, Lattice Prss, pp. 177–182.

*Primary Examiner*—Tom Thomas
*Attorney, Agent, or Firm*—Popham, Haik, Schnobrich & Kaufman, Ltd.

[57] ABSTRACT

A method for fabricating a storage electrode of a DRAM cell capable of preventing impurities from excessively moving from the storage electrode to diffusion regions. The storage electrode is formed by a double formation of polysilicon layers. An undoped polysilicon layer 11 is primarily deposited over the entire exposed surface of the resulting structure to a thickness corresponding to 40 to 50% of a predetermined thickness of the storage electrode. A doped polysilicon layer is secondarily deposited over the undoped polysilicon layer to a thickness corresponding to 60 to 50% of the predetermined thickness of the storage electrode. The doped polysilicon layer and the undoped polysilicon layer are subjected to a patterning so that predetermined portions thereof are removed so as to form the storage electrode.

2 Claims, 1 Drawing Sheet

METHOD FOR FABRICATING STORAGE ELECTRODE OF DYNAMIC RANDOM ACCESS MEMORY CELL

BACKGROUND OF THE INVENTION

1. Field of the Invention

The present invention relates to a method for fabricating a storage electrode of a dynamic random access memory (DRAM) cell.

2. Description of the Prior Art

As the integration degree of a DRAM cell increases, sufficient amount of electric charge is required for operation of the DRAM cell. To this end, the DRAM cell includes a storage electrode stacked in a three dimensional structure.

FIG. 1 illustrates a DRAM cell having a storage electrode of a stacked structure in the general type as follows.

A field oxide film 2 is formed on a predetermined portion of a silicon substrate 1; over the silicon substrate 1, numerous MOSFETs are then formed, each of which includes a gate oxide film 3, a gate electrode 4, and diffusion regions 5A and 5B for a source and a drain; an insulating film 6 is formed around each gate electrode 4; a bit line 7 is then formed which is connected to the diffusion region 5A; over the entire surface of the resulting structure, an insulating layer 8, for example a BPSG layer, showing a good flow characteristic is formed; over the insulating layer 8, an inner insulating layer 9, for example interpolyoxide, is then formed; thereafter, the inner insulating layer 9 and the insulating layer 8 are etched at their portions disposed over each diffusion region 5B so as to form contact holes and a storage electrode 10 of polysilicon layer is finally formed which is in contact with each diffusion region 5B.

The structure fabricated in a manner as mentioned above has a high aspect rate a/b between the height "a" and the width "b" of the contact hole which is for contact with the storage electrode. This aspect rate becomes higher at a higher integration degree.

On the other hand, the storage electrode is mainly comprised of a polysilicon layer. The polysilicon layer is doped with impurities by use of an ion implantation process or a POCl$_3$ doping process so that the storage electrode has a desired resistance.

However, it is difficult to make resistance uniformly by doping impurities uniformly in the polysilicon layer for the storage electrode embedded in a contact hole showing a high aspect rate.

For uniformly doping the impurities in the polysilicon layer, an in-situ process has been proposed. In accordance with the in-situ process, the impurities are doped in a polysilicon layer at the same time the poly-silicon layer is being deposited. In order to form a storage electrode having a low resistance, high concentration impurities should be implanted in a polysilicon layer. In this case, however, the impurities implanted in the polysilicon layer may be excessively diffused in diffusion regions for source and drain on the bottom of a contact hole when a subsequent thermal process is performed, so that the diffusion regions may be enlarged to the dotted range, as shown in FIG. 1. As a result, the channel length of each MOSFET becomes short. This raises a problem in operation of a device finally produced, such as a variation in threshold voltage.

SUMMARY OF THE INVENTION

Therefore, an object of the invention is to eliminate the above-mentioned problems encountered in the prior art and to provide a method for fabricating a storage electrode of a DRAM cell capable of preventing impurities from excessively moving from the storage electrode to diffusion regions by depositing a polysilicon layer undoped with impurities to a thickness corresponding to 40 to 50% of the total thickness of a polysilicon layer for the storage electrode and then depositing a polysilicon layer doped with impurities to a thickness corresponding to the balance thickness of the storage electrode polysilicon layer.

In accordance with the present invention, this object can be accomplished by providing a method for fabricating a DRAM cell, comprising the processes of forming a MOSFET on a silicon substrate; forming an insulating layer over said MOSFET; etching a predetermined portion of said insulating layer to form a contact hole for a storage electrode, a diffusion region of said MOSFET being partially exposed through said contact hole; forming an undoped polysilicon layer over the entire exposed surface of the resulting structure to a predetermined thickness; forming a doped polysilicon layer over said undoped polysilicon layer to a predetermined thickness; and removing predetermined portions of said doped polysilicon layer and said undoped polysilicon layer by patterning process and then forming a storage electrode.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 2:
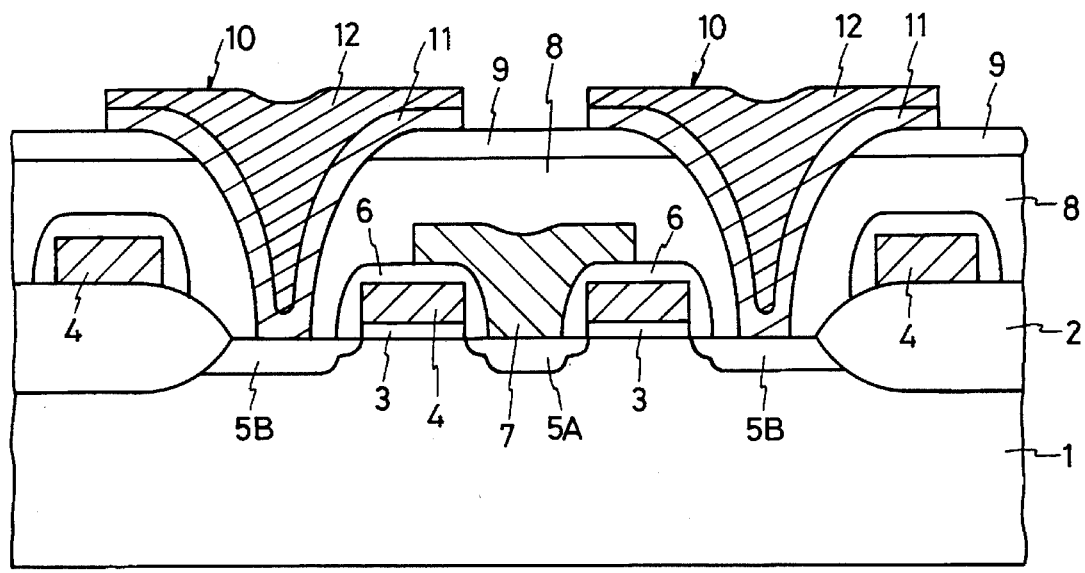
FIG. 2 is a sectional view of a DRAM cell including a storage electrode formed in accordance with the present invention.

FIG. 2 is a sectional view of a DRAM cell including a storage electrode formed in accordance with the present invention after forming MOSFETs and bit lines in accordance with well-known techniques. This DRAM cell will now be described as follows.

Figure 1:
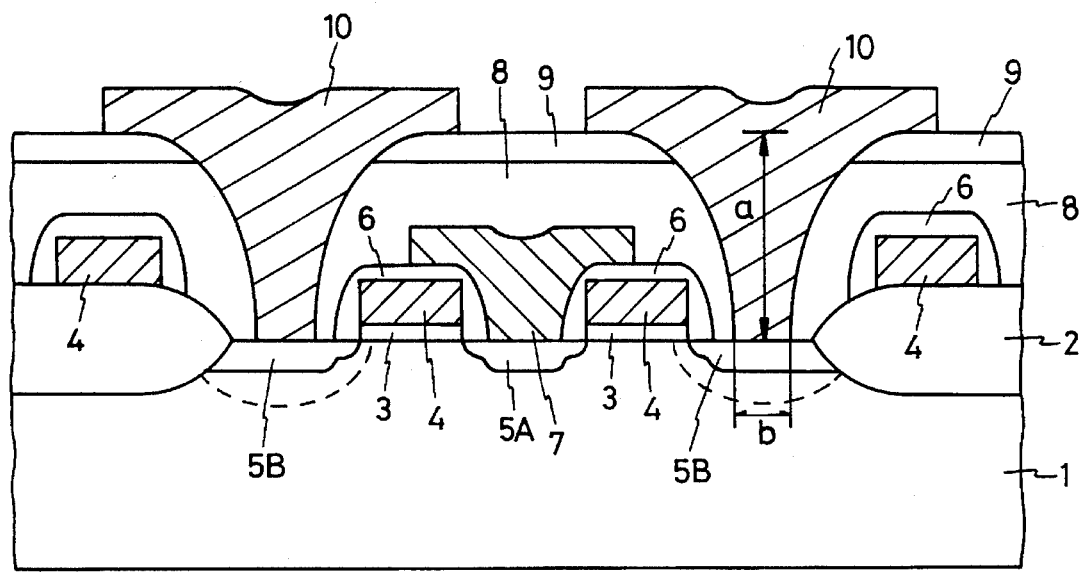
FIG. 1 is a schematic sectional view illustrating a DRAM cell including a storage electrode formed in accordance with the prior art.

As in FIG. 1, with well-known techniques, on a silicon substrate 1, numerous MOSFETs are formed, each of which includes a gate oxide film 3, a gate electrode 4, and diffusion regions 5A and 5B for a source and a drain; an insulating film 6 is formed around each gate electrode 4; a bit line 7 is then formed on the diffusion region 5A; over the entire exposed surface of the resulting structure, an insulating layer 8 showing a good flow and characteristic an inner insulating layer 9 are formed; and, thereafter, contact holes are formed. Through the contact holes, the diffusion regions 5B are outwardly exposed.

Subsequently, in accordance with the present invention a storage electrode 10 is formed by a double formation of polysilicon layers. In other words, an undoped polysilicon layer 11 is primarily deposited over the entire exposed surface of the resulting structure to a thickness corresponding to 40 to 50% of a predetermined thickness of the storage electrode 10. Then, a doped polysilicon layer 12 is secondarily deposited over the undoped polysilicon layer 11 to a thickness corresponding to 60 to 50% of the predetermined thickness of the storage electrode 10. The doped polysilicon layer 12 and the undoped polysilicon layer 11 are then subjected to a patterning so that predetermined portions thereof are removed so as to form the storage electrode 10.

The deposition of the doped polysilicon layer 12 is achieved by use of an in-situ process wherein during the deposition, a source gas of $Si_2H_6$ and $PH_3/N_2$ or a source gas of $SiH_4$ and $PH_3/SiH_4$ are injected.

In a thermal process following the formation of the pattern for the storage electrode 10 as the above the impurities in the upper doped polysilicon layer 12 is diffused in the lower undoped polysilicon layer 11 so as to uniformly dope all portions of the polysilicon layers. As a result, it is possible to form a storage electrode having a desired resistance.

In accordance with the present invention, the impurities implanted in the doped polysilicon layer for the storage electrode are hardly diffused to the diffusion regions for the source and drain. As a result, there is no adverse affect on the characteristic of a device finally produced.

Since the deposition of the undoped polysilicon layer and the doped polysilicon layer is achieved by use of the in-situ process carried out in a single tube, it is possible to improve the productivity and the thin film characteristic of the storage electrode.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a DRAM cell, comprising the steps of:

forming a MOSFET on a silicon substrate;

forming an insulating layer over said MOSFET;

etching a portion of said insulating layer to form a contact hole for a storage electrode;

forming an undoped polysilicon layer over the entire exposed surface of the resulting structure;

forming a doped polysilicon layer over said undoped polysilicon layer; and removing portions of said doped polysilicon layer and said undoped polysilicon layer by a patterning process and thereby forming a storage electrode made of two layers, said two layers consisting of said undoped polysilicon layer and said doped polysilicon layer wherein said undoped polysilicon layer has a thickness that corresponds to 40 to 50% of the thickness of said storage electrode, and wherein said doped polysilicon layer has a thickness that corresponds to 60 to 50% of the thickness of said storage electrode.

2. A method in accordance with claim 1, wherein said step of depositing said doped polysilicon layer is achieved by use of an in-situ process carried out by injecting a source gas of $Si_2H_6$ and $PH_3/N_2$ or a source gas of $SiH_4$ and $PH_3/SiH_4$ in a tube.

\* \* \* \* \*